(12) United States Patent  
De Los Santos

(10) Patent No.: US 6,304,153 B1
(45) Date of Patent: Oct. 16, 2001

(54) RESONATOR TUNING SYSTEM

(75) Inventor: Hector J. De Los Santos, Inglewood, CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/619,176

(22) Filed: Jul. 19, 2000

(51) Int. Cl.[7] ....................................................... H03B 5/18
(52) U.S. Cl. ..................... 331/117 D; 331/96; 331/177 R
(58) Field of Search ................ 331/96–102, 107 SL, 331/107 DD, 107 C, 107 P, 117 D, 177 R

(56) References Cited

U.S. PATENT DOCUMENTS 4,733,182 * 3/1988 Clarke et al. ......................... 324/301
5,210,763 * 5/1993 Lewis et al. ........................... 372/26

* cited by examiner

Primary Examiner—David Mis
(74) Attorney, Agent, or Firm—Terje Gudmestad

(57) ABSTRACT

A resonator tuning system includes an apparatus coupled to a resonator for changing the resonator's resonance frequency. Tuning of the resonator is accomplished by varying the coupling to a capacitor or varactor, rather than by varying the capacitor. An interferometer, such as a Mach-Zender interferometer is coupled to the resonator and changes the resonance of the resonator by applying an actuation voltage to vary the coupling to the resonator. In this way, a resonator may be tuned and maintain high unloaded Q properties while being coupled to a varactor or other load.

18 Claims, 2 Drawing Sheets

RESONATOR TUNING SYSTEM

TECHNICAL FIELD

The present invention relates generally to satellite communication systems, and more particularly, to a resonator tuning system for satellite communication systems.

BACKGROUND ART

Satellites and other spacecraft are in widespread use for various purposes including scientific research and communications. These scientific and communications missions, however, cannot be accurately fulfilled without wireless communication between a ground station and the spacecraft. In many applications, the satellite relies upon a wireless communication to send and receive electronic data to perform attitude and position corrections, diagnostic status checks, communication calculations and other functions. Without accurate wireless communication, proper satellite function is hindered and at times adversely effected.

Many modern spacecraft use resonator tuning systems for changing communication frequencies. The prior art systems for changing communication frequencies are predicated upon coupling a voltage controlled capacitor (varactor) to a resonator in order to change its resonance frequency. There are two general cases for resonator tuning systems, the lumped case and the distributed case.

In the lumped case, the resonance frequency $f_{0\_lumped}$ of a resonator with capacitance C and inductance L is given by:

$$f_{0\_lumped} = 1 \frac{1}{\sqrt{L \cdot C}} \quad (1)$$

Tuning is effected by connecting the varactor having capacitance $C_{var}(V_{control})$, either in series or in shunt with the resonator. When connected in series, the resonant frequency becomes:

$$f_{0\_lumped}^{Series} = 1 \frac{1}{\sqrt{L \cdot \frac{C \cdot C_{var}(V_{control})}{C + C_{var}(V_{control})}}} \quad (2)$$

When, on the other hand, the varactor is connected in shunt with the resonator, the resonance frequency is given by:

$$f_{0\_lumped}^{Shunt} = 1 \frac{1}{\sqrt{L \cdot (C + C_{var}(V_{control}))}} \quad (3)$$

In the distributed case, the varactor is used to terminate a transmission line of length equal to one-quarter wavelength at the frequency of interest. Then, by virtue of the impedance inverter effect, the input impedance of the transmission line acts inductive, with an inductance value that is a function of the terminating capacitor value. Thus the effective inductance L, of the resonator being loaded by the transmission line, is changed and consequently its resonance frequency is changed.

The fundamental disadvantage of these approaches stems from the fact that the semiconductor varactor is not a pure capacitor, but contains an intrinsic parasitic resistance that introduces losses in the resonator, thus lowering its unloaded Q. The consequence of a reduction in the unloaded Q may be appreciated by examining the carrier to noise (C/N) ratio in a Voltage Controlled Oscillator (VCO), where (C/N) is given by:

$$\frac{C}{N} = \frac{(2 \times Q_L \times \Delta f)^2 \times P_o}{(Loss \times f_o)^2 \times (2 \times k \times T \times B \times NF)} \quad (4)$$

Where $Q_L$ is the loaded Q of the resonator, Loss is the loss factor in the resonator, $f_o$ is the frequency of oscillation, $\Delta f$ is the offset frequency from $f_0$, $P_0$ is the output power of the oscillator, k is Boltzrnann's constant, T is the absolute temperature, B is the measurement bandwidth, and NF is the noise figure of the amplifier. Examination of equation (4) reveals that in order to obtain high C/N ratio, the loaded Q must be high. The loaded Q is highest when it experiences minimum external loading.

The disadvantages associated with these conventional resonator tuning techniques have made it apparent that a new technique for resonator tuning is needed. The new technique should maintain the high, unloaded Q properties of resonators, while significantly reducing phase noise. Additionally, the new technique should allow superior frequency tuning capability. The present invention is directed to these ends.

SUMMARY OF THE INVENTION

It is, therefore, an object of the invention to provide an improved and reliable resonator tuning system. Another object of the invention is to maintain the high, unloaded Q properties of resonators, while significantly reducing phase noise.

In accordance with the objects of this invention, a resonator tuning system is provided. In one embodiment of the invention, a resonator tuning system includes an apparatus coupled to a resonator for changing the resonator's resonance frequency. Tuning of the resonator is accomplished by varying the coupling to a capacitor or varactor, rather than by varying the capacitor. An interferometer, such as a Mach-Zender interferometer, is coupled to the resonator and changes the resonance of the resonator by applying an actuation voltage to vary the coupling to the resonator. In this way, a resonator may be tuned and maintain high unloaded Q properties while being coupled to a varactor or other load.

The present invention thus achieves an improved resonator tuning system. The present invention is advantageous in that it allows superior frequency tuning capability over the prior art.

Additional advantages and features of the present invention will become apparent from the description that follows, and may be realized by means of the instrumentalities and combinations particularly pointed out in the appended claims, taken in conjunction with the accompanying drawings.

BRIEF DESCRIPTION OF THE DRAWINGS

In order that the invention may be well understood, there will now be described some embodiments thereof, given by way of example, reference being made to the accompanying drawings, in which.

BEST MODES FOR CARRYING OUT THE INVENTION

Figure 1:
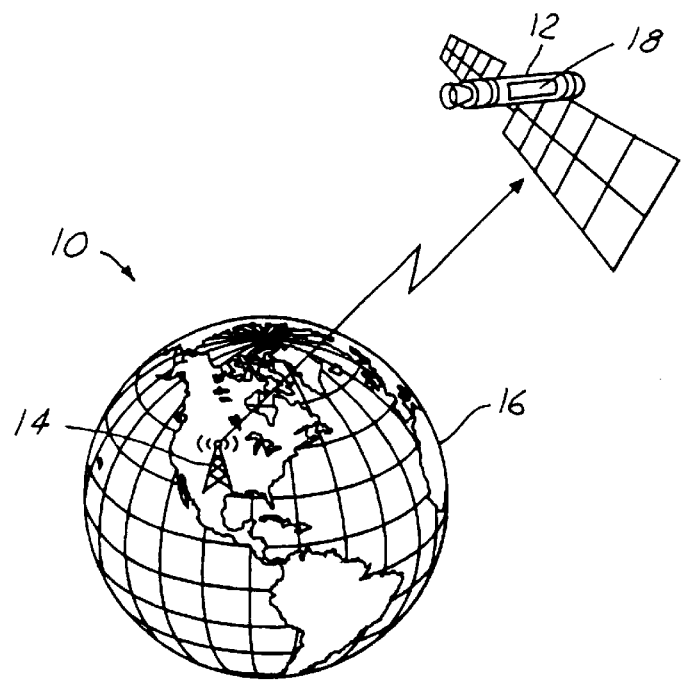
FIG. 1 is a perspective view of a satellite system having a resonator tuning system in accordance with one embodiment of the present invention.

In the following Figures, the same reference numerals will be used to identify identical components in the various views. The present invention is illustrated with respect to a resonator tuning system, particularly suited for the aerospace field. However, the present invention is applicable to various other uses that may require resonator tuning systems.

Referring to FIG. 1, a perspective view of a satellite system 10 in accordance with one embodiment of the present invention is illustrated The satellite system 10 is comprised of one or more satellites 12 in communication with a ground station 14 located on the Earth 16. Satellite 12 relies upon wireless communication to send and receive electronic data to perform attitude and position corrections, diagnostic status checks, communication calculations and other functions. Without accurate wireless communication, proper satellite function is hindered and at times adversely effected. Each satellite 12 contains one or more resonator tuning systems 18 to change communication frequencies.

Figure 2:
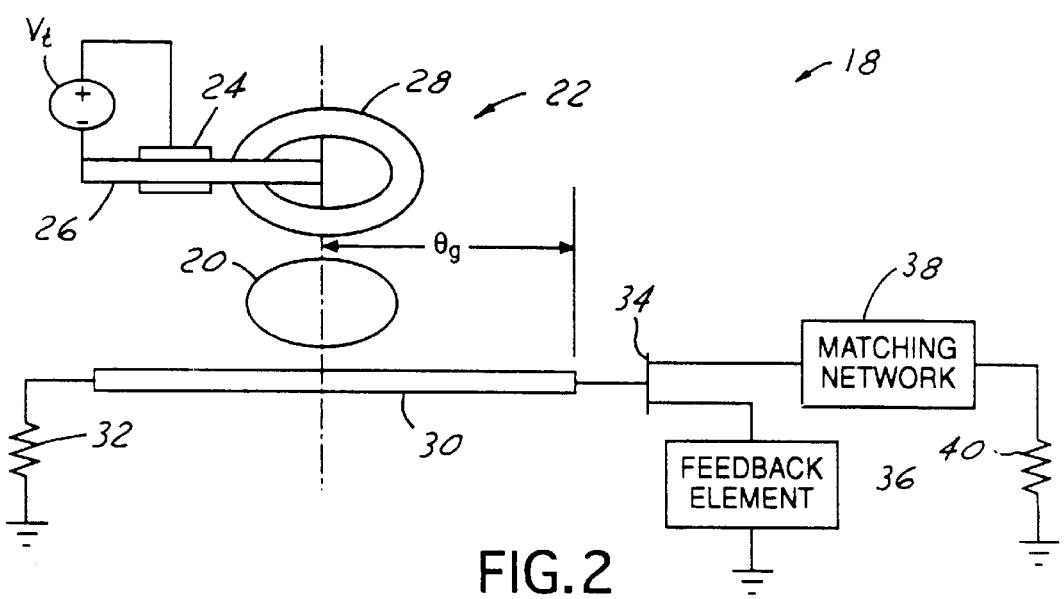
FIG. 2 is a block diagram of a resonator tuning system in accordance with one embodiment of the present invention.

Referring to FIG. 2, a resonator tuning system 18 in accordance with one embodiment of the present invention is illustrated. Resonator tuning system 18 uses a structure in which tuning of a resonator 20 is accomplished by varying the coupling to a capacitor, rather than by varying the capacitor. In terms of the prior art, the effective transformer ratio, $N_t$ is varied.

Using impedance-transforming properties of a transformer, the input to the primary port of a 1: $N_t$ transformer whose secondary is loaded with a capacitor $C_{tuning}$ or an inductor $L_t$ results in a capacitance $N_t^2 C_{tuning}$ or an inductance $L_t/N_t^2$, respectively. To vary the effective coupling, $N_t$, a Mach-Zender interferometer 22 is coupled to resonator 20. in the present invention, Mach-Zender interferometer 22 is implemented as a capacitor, specifically a ring capacitor. One skilled in the art, however, would realize that the present invention may be practiced with either a capacitor or inductor.

Mach-Zender interferometer 22 acts as a tunable capacitor and includes a bottom electrode 24, an air-bridge 26, and a ring branch 28. Applying an actuation voltage $V_t$ causes air-bridge 26 to deflect towards ring branch 28, thus loading the ring branch 28 with variable capacitance, which in turn changes the coupling to the ring branch 28 and as a consequence, the effective capacitance coupled to resonator 20. Resonator 20 is coupled to a transmission line 30 having a termination 32 at one end and an active element 34 at the opposite end. Active element 34 is coupled to both a feedback element 36 and a matching network 38 that is coupled to a terminating load 40.

Figure 3:
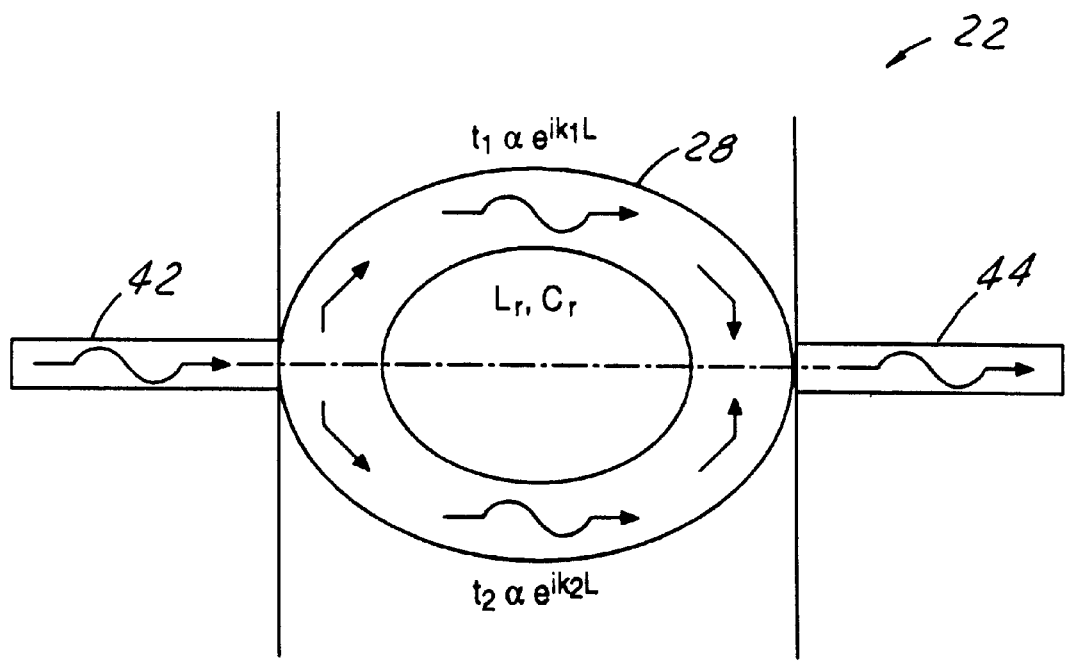
FIG. 3 is a depiction of a Mach-Zender interferometer in accordance with one embodiment of the present invention is illustrated.

Referring now to FIG. 3, a Mach-Zender interferometer 22 in accordance with one embodiment of the present invention is illustrated. Assuming balance amplitudes, i.e., $|t_1|=|t_2|=1$, the transmission, T, which relates the output-to-input wave amplitude ratio is given by:

$$T=|t|^2=2\cdot\{1+\cos[L\cdot(k_2-k_1)]\} \quad (5)$$

where k is the propagation constant defined by:

$$k=\omega\sqrt{L_r C_r}$$

with ω being the frequency and $L_r$ and $C_r$ being the inductance and capacitance per unit length, respectively. In the present invention, L is one-half the mean circumference of ring branch 28. For a given L, T is a function of $k_1$ and $k_2$, and T is a measure of the coupling between input 42 and output 44, when there is an output transmission line. When there is not an output transmission line, the waves in each branch of ring 28 simply counter propagate and T still represents the coupling to ring 28. In this case, however, it is more appropriate to consider the reflection from ring 28 R=1−T. This coupling can be varied by changing $k_2-k_1$, in particular, by changing $C_r$ on one of the ring branches.

The present invention maintains the high, unloaded Q properties of traditional resonators, such as dielectric resonators, while significantly reducing phase noise. Additionally, the present invention allows superior frequency tuning capability, while achieving the highest loaded Q/lowest phase noise possible.

From the foregoing, it can be seen that there has been brought to the art a new and improved resonator tuning system. It is to be understood that the preceding description of the preferred embodiment is merely illustrative of some of the many specific embodiments that represent applications of the principles of the present invention. Clearly, numerous and other arrangements would be evident to those skilled in the art without departing from the scope of the invention as defined by the following claims:

What is claimed is:

1. A resonator tuning system comprising:
   a waveguide coupled to an active element, said waveguide propagating an electromagnetic wave for a given frequency;
   a matching network and a feedback element coupled to said active element;
   a resonator coupled to said wavegude, said resonator tuning said given frequency for said waveguide;
   an interferometer coupled to said resonator, said interferometer changing a resonance of said resonator by varying a coupling to said resonator.

2. The resonator tuning system as recited in claim 1, wherein said interferometer is a Mach-Zender interferometer.

3. The resonator tuning system as recited in claim 1, wherein said interferometer is capacitive.

4. The resonator tuning system as recited in claim 1, wherein said interferometer is inductive.

5. The resonator tuning system as recited in claim 1, wherein said interferometer is coupled in series with said resonator.

6. The resonator tuning system as recited in claim 1, wherein said interferometer is coupled in shunt with said resonator.

7. The resonator tuning system as recited in claim 1, wherein said interferometer is used to terminate said transmission line.

8. The resonator tuning system as recited in claim 7, wherein said transmission line is one-quarter wavelength at said given frequency.

9. The resonator tuning system as recited in claim 1, wherein said interferometer is a ring capacitor having an electrostatically actuated MEM air-bridge disposed across one branch.

10. A satellite communications system, comprising:
    a ground station;
    a satellite in orbit and in communication with said ground station, said satellite having a resonator tuning system comprising;

a waveguide coupled to an active element, said waveguide propagating an electromagnetic wave for a given frequency;

a matching network and a feedback element coupled to said active element;

a resonator coupled to said wavegude, said resonator tuning said given frequency for said waveguide; and an interferometer coupled to said resonator, said interferometer changing a resonance of said resonator by varying a coupling to said resonator.

11. The satellite communications system as recited in claim 10, wherein said interferometer is a Mach-Zender interferometer.

12. The satellite communications as recited in claim 10, wherein said interferometer is capacitive.

13. The satellite communications system as recited in claim 10, wherein said interferometer is inductive.

14. The satellite communications system as recited in claim 10, wherein said interferometer is coupled in series with said resonator.

15. The satellite communications system as recited in claim 10, wherein said interferometer is coupled in shunt with said resonator.

16. The satellite communications system as recited in claim 10, wherein said interferometer is used to terminate said transmission line.

17. The satellite communications system as recited in claim 16, wherein said transmission line is one-quarter wavelength at said given frequency.

18. The satellite communications system as recited in claim 10, wherein said interferometer is a ring capacitor having an electrostatically actuated MEM air-bridge disposed across one branch.

* * * * *